United States Patent [19]

Saito et al.

[11] Patent Number: 4,721,553
[45] Date of Patent: * Jan. 26, 1988

[54] METHOD AND APPARATUS FOR MICROWAVE ASSISTING SPUTTERING

[75] Inventors: Hiroshi Saito, Fujisawa; Yasumichi Suzuki, Yokohama; Shuuzoo Sano, Yokohama; Tamotsu Shimizu, Yokohama; Susumu Aiuchi, Yokohama, all of Japan

[73] Assignee: Hitachi, Ltd., Tokyo, Japan

[*] Notice: The portion of the term of this patent subsequent to Sep. 9, 2003 has been disclaimed.

[21] Appl. No.: 769,505

[22] Filed: Aug. 23, 1985

[30] Foreign Application Priority Data

Aug. 31, 1984 [JP] Japan ................. 59-180532
Oct. 4, 1984 [JP] Japan ................. 59-207058
Oct. 26, 1984 [JP] Japan ................. 59-223944
Feb. 22, 1985 [JP] Japan ................. 60-32604

[51] Int. Cl.$^4$ .......................................... C23C 14/34
[52] U.S. Cl. ................... 204/192.12; 204/192.1; 204/298
[58] Field of Search ............... 204/192 R, 298, 192.1, 204/192.12

[56] References Cited

U.S. PATENT DOCUMENTS

| | | | |
|---|---|---|---|
| 4,265,730 | 5/1981 | Hirose et al. | 204/298 |
| 4,282,267 | 8/1981 | Kuyel | 204/298 X |
| 4,298,419 | 11/1981 | Suzuki et al. | 204/298 X |
| 4,384,933 | 5/1983 | Takasaki | 204/298 X |
| 4,492,620 | 1/1985 | Matsuo et al. | 204/192 R |
| 4,525,262 | 6/1985 | Class et al. | 204/298 X |
| 4,534,842 | 8/1985 | Armal et al. | 204/298 X |
| 4,610,770 | 9/1986 | Saito et al. | 204/298 X |

*Primary Examiner*—John F. Niebling
*Assistant Examiner*—Nam X. Nguyen
*Attorney, Agent, or Firm*—Antonelli, Terry & Wands

[57] ABSTRACT

Disclosed herein are apparatuses of several types for forming a film at an increased rate that is necessary for putting the microwave assisting sputtering into practice on an industrial scale. The feature resides in that a plasma is maintained uniformly on the whole surface of target composed of a material to be sputtered. This makes it possible to avoid the target from being thermally destroyed by the increased energy of sputtering. Further, in order to prevent damage on a substrate on which the film is to be sputtered by plasma for sputtering, consideration is given to the arrangement of magnetic devices in order to form the film by positively introducing the plasma onto the substrate on which the film is to be formed and, at the same time, effecting the sputtering. There are further disclosed an apparatus in which the plasma is generated by microwaves at a position close to the target to effectively utilize the energy of microwaves for the sputtering, and a cathode structure on which a conical target is placed by taking into consideration the fact that the sputtered particles emitted from the target travel in compliance with the cosine law.

33 Claims, 22 Drawing Figures

FIG. 15(a)　　FIG. 15(b)
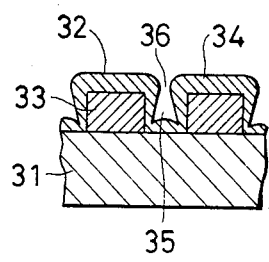 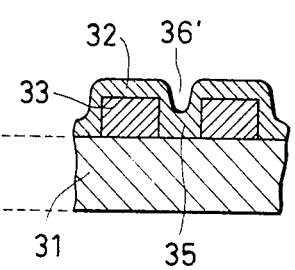
FIG. 16(a)　　FIG. 16(b)
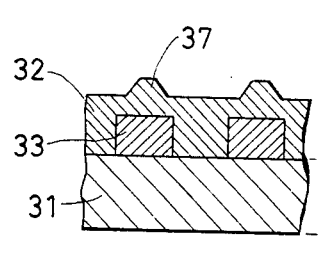 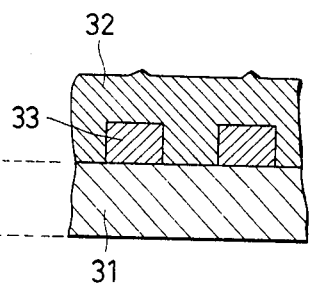

METHOD AND APPARATUS FOR MICROWAVE ASSISTING SPUTTERING

FIELD OF INVENTION

The present invention relates to technique for forming thin films employed for manufacturing semiconductor devices, and particularly to microwave assisting sputtering.

BACKGROUND OF INVENTION

To form a film by sputtering, ions having energy greater than a predetermined value are permitted to impinge upon a target material placed on the cathode, so that atoms or particles of the target material emitted therefrom are deposited on a semiconductor substrate to form a thin film.

As disclosed in Japanese Patent Publication No. 19319/1978, there is provided a cathode having a surface of target material, and a pair of magnetic poles are provided on a surface of the cathode on the side opposite to the target surface. Part of the lines of magnetic force appearing between the pair of magnetic poles emerges above the surface of the target material, and is curved to form a closed region as defined by arcuate lines of magnetic force and the surface of the target material. Charged particles that are generated by applying a voltage across the cathode and the anode are confined in the closed region. With the charged particles being confined in the closed region, it is made possible to form a film under a lower pressure or at a higher rate relying upon a high-density plasma than by using a two-pole sputtering apparatus.

According to this method, a-c or d-c electric power applied to the electrodes maintains the plasma and supplied energy to the ions that are incident upon the target surface from the plasma.

To increase the rate of forming film with this apparatus, it is necessary to increase the electric power that is applied to increase the plasma density. However, if the increased electric power is applied, the ions impinging upon the target surface impart increased amount of energy most of which is converted into heat when the target surface is sputtered, whereby the temperature rises. As the target temperature rises, however, the target may be ruptured or an adhered portion at the back of the target surface may be melted due to temperature stress that builds up significantly in the target. This fact imposes a limitation on the rate of forming films. Further, since the plasma region is limited to a ring form, the target is corroded in the form of a ring correspondingly. Therefore, only a portion of the target material contributes to forming the film; i.e., the utilization efficiency of the target is small.

As a method to increase the rate of forming a film under the condition where the rise of target temperature is restrained by lowering the ion impingement energy, Japanese Patent Laid-Open No. 75839/1983 proposes to employ microwaves to generate plasma. According to this method, microwaves are supplied to the cathode which confines charged particles of plasma by the lines of magnetic force, to generate plasma of a high density by the energy of microwaves, and charged particles of plasma are accelerated by the voltage applied across the anode and the cathode so as to impinge upon the target, thereby to form a film by sputtering.

With this method, the number of ions impinging upon the target increases by an amount by which the plasma density is increased, and the film is formed at a rate larger than the above-mentioned Japanese Patent Application No. 19319/1978. However, the region where the ions impinge upon the target, i.e., the region of corrosion is limited to the area where the plasma is confined in closed space that is defined by the lines of magnetic force and the target surface. That is, ions are accelerated by an electric field nearly perpendicularly to the target surface, and impinge upon the target to spring surface to cause atoms or particles of the target from the surface thereof. Therefore, the target is corroded. The region of corrosion develops only under the plasma that is generated inside the lines of magnetic force and is, hence, limited to a particular area on the target. Accordingly, if an increased electric power is applied to the cathode in order to increase the rate of forming films, the target surface is locally heated at high temperatures like in the above-mentioned apparatus, and the target is cracked. Further, utilization efficiency of the target is not enhanced, either.

Another sputtering apparatus utilizing plasma by the microwaves has been disclosed in Japanese Patent Laid-Open No. 47728/1984. According to this apparatus, the plasma generated by the microwaves is used for effecting the sputtering and for ionizing the atoms or particles emitted by the sputtering. Namely, the plasma excited and generated by the microwaves is caused to migrate by a diverging magnetic field, the electric power is applied to the neighboring cathode on which the target is placed to produce the sputtering function, and particles of the target material emitted by the sputtering function are ionized and are deposited on a predetermined substrate. Therefore, the target is corroded over nearly the whole areas being bombarded with ions. However, in order to form the film by ionizing the atoms or particles emitted from the target, the target is not opposed to the substrate, and the atoms or particles emitted from the target plunge into the plasma.

The angles of atoms or particles emitted from the target are distributed according to a cosine law, and the target is not directed to the substrate on which the film is to be formed. Therefore, the atoms or particles are directly deposited in small amounts on the substrate, i.e., the film is formed by the atoms or particles that are ionized. Hence, the rate of forming the film is dependent upon the ionization efficiency. Further, if the target having a large size is employed, there arises a problem with regard to uniformity in the plasma density distribution. That is, since the plasma has not been confined on the target surface, the density of plasma becomes high near the plasma transit window and decreases as it goes away from the plasma transit window. Therefore, the central portion of the target is corroded at an increased rate. Moreover, if an increased electric power is applied to the cathode, the impingement of ions is concentrated on the central portion of the target, giving rise to the occurrence of thermal stress. Accordingly, even in this art of forming the film, problems remain unsolved with regard to thermal stress and utilization efficiency of the target, hindering the effort for increasing the film-forming rate.

BRIEF SUMMARY OF THE INVENTION

The object of the present invention is to improve the film-forming performance which is necessary to industrially apply the sputtering technique.

A more specific object of the present invention is to increase the rate of forming film by sputtering.

Another object of the present invention is to lengthen the life of the target used for the sputtering, and to improve utilization efficiency of the target.

A further object of the present invention is to improve the quality of the film formed by sputtering, and particularly to prevent damage on the substrate on which the film is to be formed by sputtering, to uniformalize the film, and to improve controllability for forming film.

To achieve the above-mentioned objects, a feature according to the present invention resides in the introduction of microwaves to generate the plasma. Namely, there are two modes, i.e., when the sputtering gate and the substrate on which the film is to be formed are opposed to each other, and the microwave energy is introduced from a side surface thereof, and when the microwave energy is introduced through the center of the sputtering gate that is opposed to the substrate on which the film is to be formed.

There are two more modes, i.e., whether a magnetic device or a power supply is provided to apply electric power to the substrate on which the film is to be formed. Namely, there are a mode using an ordinary sputtering and a mode using a bias sputtering.

There further exists a mode in which the magnetic field is so controlled that the plasma covers the whole surface of the target uniformly, and the plasma is confined by a variety of magnetic fields.

According to the method of present invention of forming a film by sputtering, the plasma is generated by being excited by the microwaves, a magnetic device is used to confine the plasma maintaining a high density ($n_e = 10^{11}$ to $10^{13}$ $1/cm^3$) over a wide area, and the shape for confining the plasma and the plasma density are controlled by the magnetic device to form a uniform film of a small thickness by sputtering.

BRIEF DESCRIPTION OF THE DRAWINGS

FIGS. 5 and 6 are diagrams showing an embodiment in which the plasma generated by microwaves is confined on the side of target in order to prevent the substrate from being damaged by the plasma, and wherein FIG. 5 is a section view showing a portion for forming film, and FIG. 6 is a perspective view;

FIGS. 7 to 14 are diagrams showing sputtering apparatuses in which microwaves are introduced from the center of the sputtering gate; wherein FIG. 7 is a diagram showing a sputtering apparatus which employs the target of the shape of a flat plate, and in which the plasma generated by microwaves is moved by the magnetic field controlled by a magnetic device provided on the back side of the target and by a magnetic device provided in a waveguide, and is uniformly distributed over the whole surface of the target plate;

FIG. 8 is a diagram showing the lines of magnetic force and plasma of FIG. 7;

FIG. 9 is a diagram showing the case where the target is formed to have a conical side surface;

FIG. 10 is a diagram showing the lines of magnetic force and plasma of FIG. 9;

FIGS. 11 and 13 are diagrams showing embodiments in which a magnetic device and a power supply for sputtering the substrate are provided near the substrate holder of the sputtering apparatuses of FIGS. 7 and 9;

FIGS. 12 and 14 are diagrams showing lines of magnetic force of FIGS. 11 and 13; and FIGS. 15 and 16 are diagrams showing a substrate in the steps for forming a film by sputtering.

FIGS. 17 to 20 are diagrams showing other sputtering apparatuses in which microwaves are introduced from the center of the sputtering gate; wherein FIG. 17 is a diagram showing a sputtering apparatus in which the plasma generated by microwaves is held by the magnetic field controlled by a magnetic device provided on the back side of the target and is uniformly distributed over the whole surface of the target plate without a magnetic device provided in a waveguide;

FIG. 18 is a diagram showing the lines of magnetic force of FIG. 17;

FIG. 19 is a diagram showing the case where the target is formed to have a conical side surface;

FIG. 20 is a diagram showing the lines of magnetic force of FIG. 19.

DETAILED DESCRIPTION

Figure 1:
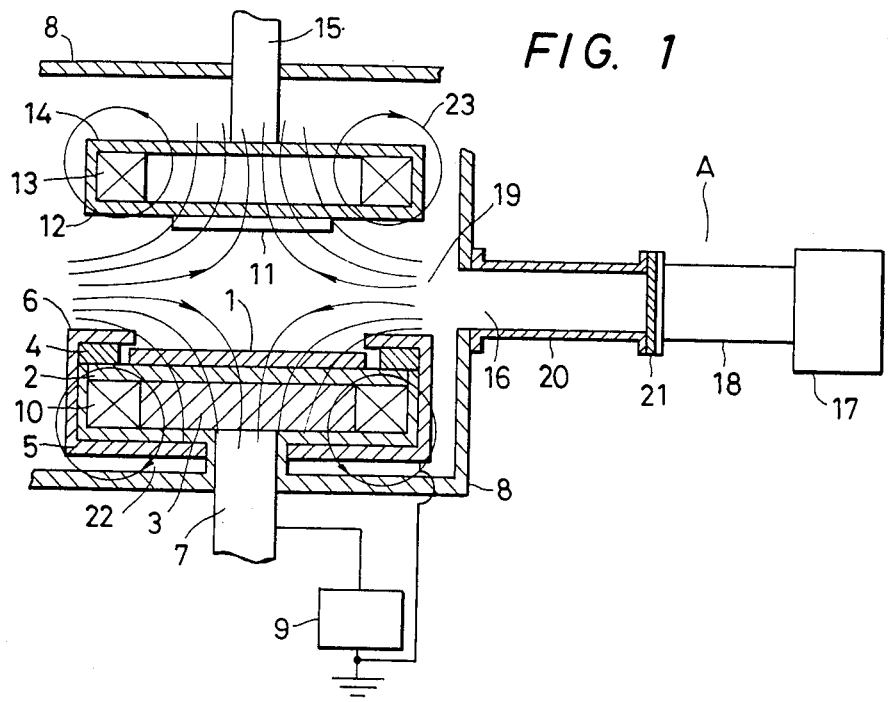
FIG. 1 is a diagram showing sputtering apparatus in which microwaves are introduced from a side surface, and in which the plasma is generated by a substrate holder and by a magnetic device near a cathode which holds the target.

First, generation of plasma by microwaves will be described below generally, and then the apparatus will be described more specifically. In the drawings, the same reference numerals do not necessarily represent the same constituent elements. However, to avoid confusion that may stem from the changing reference numerals, the same reference numerals designate the same constituent elements as far as the description covers the same subject matter.

In generating the plasma by microwaves, what is important is how efficiently the microwaves contribute to generating the plasma. The plasma density is determined by this efficiency.

If expressed in terms of wave number vector k, the electromagnetic waves in plasma in the absence of magnetic field are given by, $$k = \frac{\omega^2 - \omega_p^2}{C^2}$$

where $\omega$ represents a frequency of incident electromagnetic waves, and $\omega_p$ denotes a plasma frequency.

The wave number vector k assumes a negative value when $\omega < \omega_p$, and the electromagnetic waves do not propagate through the plasma. In other words, the microwaves of a frequency of 2.45 GHz do not propagate through the plasma which has a density in excess of $7.4 \times 10^{10}/cm^3$. Namely, the plasma generated by microwaves of 2.45 GHz is not allowed to have a density greater than $7.4 \times 10^{10}/cm^3$ under the condition where no magnetic field exists.

In the plasma where a static magnetic field exists, on the other hand, the propagation condition of electromagnetic waves differs depending upon an angle subtended by the direction in which the electromagnetic waves proceed and the magnetic field. In particular, when the electromagnetic waves are introduced into the plasma in parallel with the magnetic field, a dispersion equation of circularly polarized waves in the clockwise direction is given by, $$\frac{k^2 c^2}{\omega^2} = 1 - \frac{\omega_p^2}{(\omega - \omega_{ce})(\omega - \omega_{ci})}$$

where $\omega_{ce}$ denotes a frequency of an electron cyclotron, and $\omega_{ci}$ denotes a frequency of an ion cyclotron.

The electromagnetic waves of a frequency satisfying a relation $0 < \omega < \omega_{ce}$ propagate through the plasma regardless of its density.

Namely, if a static magnetic field is established and the microwaves are introduced in parallel with the static magnetic field which has an intensity of greater than an electron cyclotron resonance (875 G at 2.45 GHz), the circularly polarized waves in the clockwise direction propagate through the plasma and supply the power of microwaves to the plasma. Therefore, the plasma frequency $\omega_p$ becomes greater than $\omega$, and the plasma density ($10^{12}$/cm$^3$ or more) becomes far greater than $7.4 \times 10^{10}$/cm$^3$.

The thus generated plasma must be confined by using a magnetic device. Otherwise, the plasma diverges and fails to assume a high density, resulting in the increase in the loss of microwave power. Further, the plasma must be quickly transferred near to the target after it is generated. This is because, the plasma diffuses while it is being transferred and loses density.

The invention will be described below in conjunction with FIGS. 1 to 4. Namely, described below is the sputtering in which plasma of a high density is generated on the whole surface of the target, the target is allowed to be corroded nearly over the whole region thereof in the step of sputtering, such that the temperature rises nearly uniformly on the whole surface of the target without extremely increasing the number of impinging ions per unit area, such that the target atoms or particles are deposited on the substrate at an increased rate, and such that the target utilization efficiency is increased. A cusp field is used to confine the plasma.

Magnetic devices are provided for the target and for the opposing external side of the substrate, so that lines of magnetic force of these magnetic devices will form opposing magnetic fields (usually called a cusp field). A microwave generator is provided such that the microwaves can be introduced nearly in parallel with the target and the surface of the substrate. Further, magnetic means is provided in the magnetic field to send plasma or microwaves, such that plasma of a high density is generated and confined between the target and the substrate. This makes it possible to cover the whole surface of the target with plasma of a high density, so that the target is corroded over nearly the whole region thereof, and further to increase the deposit rate and target utilization efficiency.

FIG. 1 is a section view showing the construction of a portion for forming film by sputtering according to an embodiment of the present invention. A backing plate 2 is arranged on the back surface of target 1, a cathode 3 is arranged in intimate contact therewith, and an anode 6 is installed on the outer periphery of the cathode 3 via a disk-like insulator 4 and a cylindrical insulator 5. The anode and cathode are installed under the condition where they are electrically insulated from a vacuum vessel wall 8 by a shaft 7 of cathode 3 maintaining vacuum, and a high-frequency or a d-c power source 9 is connected across the anode and cathode. Further, a magnet 10 is installed in the cylindrical insulator 5 on the back surface of backing plate 2.

A substrate 11 is placed on a substrate holder 12 at a position opposed to the target, a magnet 13 is installed on the side of the substrate holder 12 opposite to the substrate 11, and a holder base 14 is so arranged as to surround the magnet 13; i.e., these members are mounted under the condition where they are electrically insulated from the vacuum vessel wall 8 by a shaft 15 of the holder base 14 maintaining vacuum.

A window 16 is formed in a vacuum vessel wall in space defined by the target 1 and the opposing substrate 11 in a direction at right angles with the surfaces of the target 1 and substrate 11, and a microwave source A is installed in the window 16. The microwave source A consists of a microwave generator 17, a waveguide 18 for introducing microwaves, and a waveguide 20 for introducing microwaves into a sputter film-forming chamber 19. The waveguide 18 and the waveguide 20 are connected together via a microwave introducing chamber 21 which is made of a material (such as quartz, alumina porcelain, or the like) that permits the passage of microwaves and maintains vacuum.

Being constructed as described above, lines 22 of magnetic force of magnet 10 on the side of target 1 are set to be directed from the target surface toward the cathode 3, and lines 23 of magnetic force of magnet 13 on the side of substrate 11 are set to be directed from the surface of substrate 11 toward the substrate holder 12; i.e., lines of magnetic force are set to be directed in the opposite directions relative to each other. The interior of the sputter film-forming chamber 19 is filled with an atmosphere gas (such as argon gas or the like) and is maintained under a predetermined reduced pressure condition.

Microwaves generated by the microwave generator 17 of the microwave source A are guided through the waveguide 18, pass through the microwave introducing member 21, guided through the waveguide 20, and are introduced into the sputtering chamber 19. Here, the microwaves are introduced in parallel with the lines of magnetic force produced by magnets 10, 13, and the atmosphere gas in the sputtering chamber 19 is ionized to produce a plasma of a density greater than $7.4 \times 10^{10}$/cm$^3$. The plasma is confined by the lines of magnetic force produced by the magnets 10, 13 installed on the side of target 1 and on the side of substrate 11. By setting the intensity of magnetic field to be greater than a predetermined value, there is produced a plasma of a high density (greater than $7.4 \times 10^{10}$/cm$^3$) which is confined between the target 1 and the substrate 11.

Since a voltage is applied across the anode and the cathode from the power source 9, ions in the plasma are accelerated by the negative electric field established on the surface of target 1, and impinge upon the surface of target 1. Therefore, atoms or particles are sprung out from the surface of target 1, and deposit on the surface of substate 11 to form a thin film. In this case, since the plasma has a high density over the whole surface of target 1, the corrosion takes place over nearly the whole surface of target 1 with the lapse of sputtering time.

Figure 2:
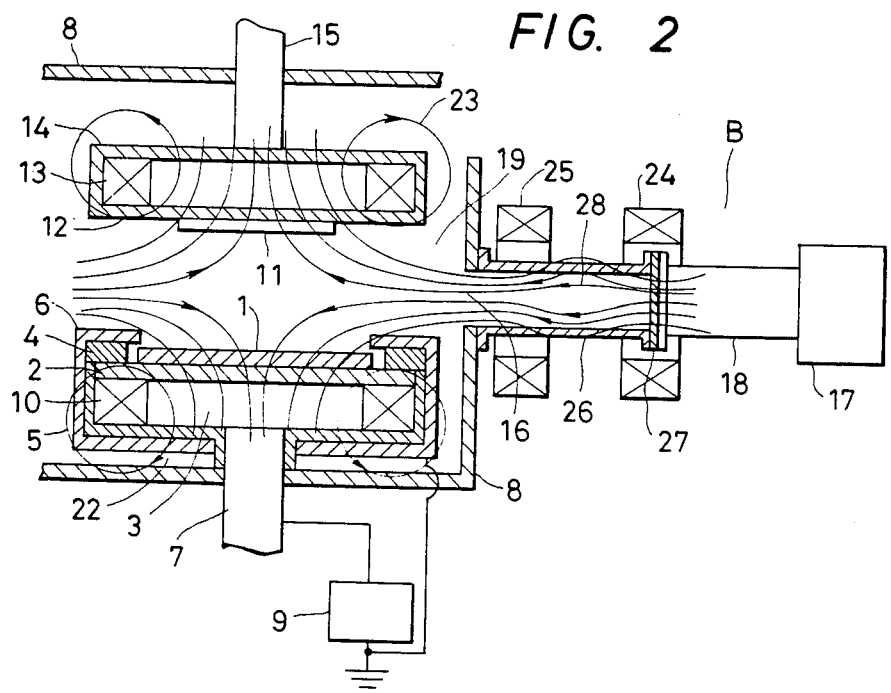
FIG. 2 is a diagram showing a sputtering apparatus in which the plasma is generated by a magnetic device provided near the end where microwaves are introduced, and is caused to migrate near to the target and the substrate.

Next, a second embodiment of the invention will be described below with reference to FIG. 2. This embodiment is different from the first embodiment with respect to the microwave source. A plasma source B has a plasma generating portion 26 and is installed at a position of window 16 of the sputter film-forming chamber 19. In the outer periphery are further installed magnets 24, 25 having a magnetic field intensity greater than the electron cyclotron resonance condition (for instance, the magnetic field intensity is 875 G when the microwave frequency is 2.45 GHz) established by the introduced microwaves, thereby to form a mirror field. The magnet 24 is positioned on the outer periphery of the microwave introducing member 27.

Being constructed as described above, microwaves are emitted from the microwave generator 17 of the plasma source B. Here, the sputter film-forming chamber 19 and the plasma generating portion 26 are filled with an atmosphere gas (such as argon gas) and is maintained under a predetermined reduced pressure condition. The microwaves which have passed through the microwave introducing member 27 ionize the atmosphere gas in the plasma generating portion 26 thereby to generate plasma.

The charged particles in the plasma generated in plasma generating portion undergo the cyclotron motion due to the magnetic field established by magnets 24, 25. Here, the magnetic field intensity by the magnet 24 is set to be greater than that produced by the magnet 25, such that the charged particles are sent into the sputter film-forming chamber 19 along lines 28 of magnetic force. Here, owing to the intense magnetic field produced by magnets 24, 25, the microwaves are easily absorbed by the plasma in the plasma generating portion 26. Despite an increased plasma density, the circularly polarized waves in the clockwise direction are not interrupted. Therefore, the plasma in the plasma generating portion 26 assumes a density which is greater than $10^{12}/cm^3$.

The plasma generated here is transferred into the sputter film-forming chamber 19 along lines 28 of magnetic force, and is confined between the target 1 and the substrate 11 due to a cusp field produced by magnet 10 on the side of target 1 and magnet 13 on the side of substrate 11. Therefore, the plasma of a high density exists on the whole surface of target. According to the second embodiment as described above, the plasma can be obtained on the whole surface of target having a density greater than that of the first embodiment.

According to the embodiment of the invention, the plasma is generated by microwaves, and the power source provided between the anode and the cathode is used to accelerate ions in the plasma. This makes it possible to set a sputtering current (number of ions impinging on the target 1) in the step of sputtering and a voltage for accelerating ions, contributing to enhance the controllability. Accordingly, the number of ions can be increased without increasing the energy for impinging ions, and the thermal shock can be reduced on the target surface.

Figure 3:
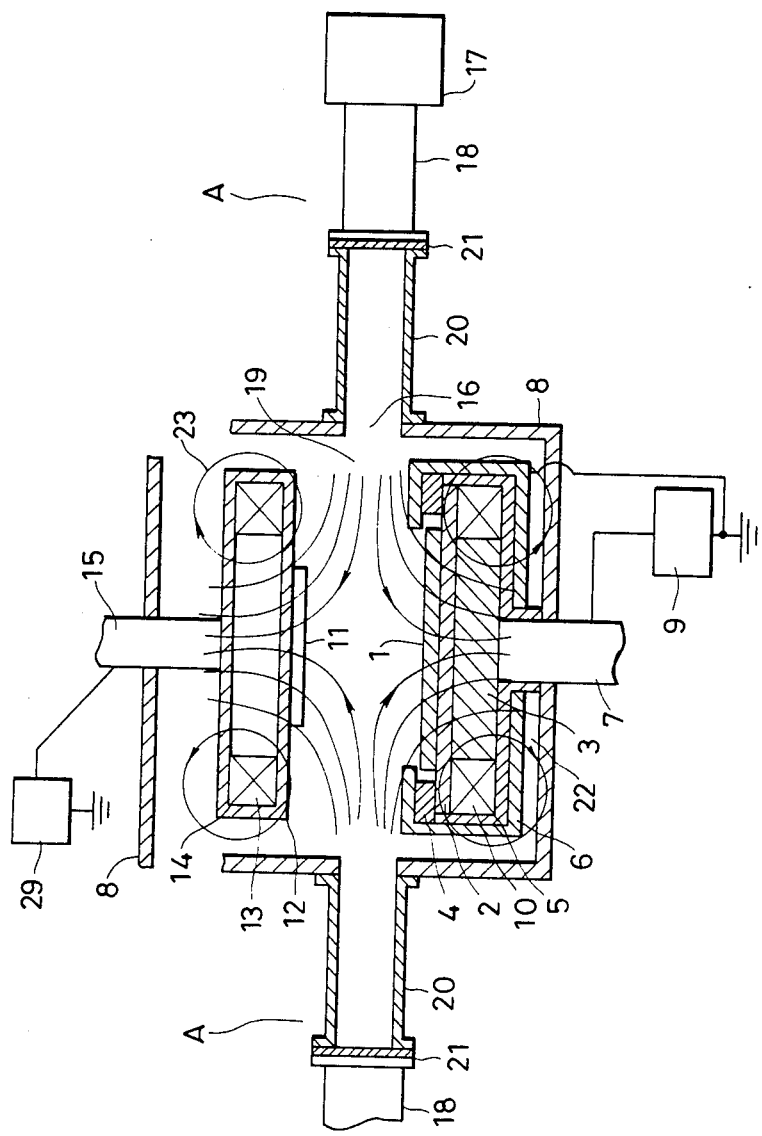
FIGS. 3 and 4 are diagrams showing constructions in which microwaves are introduced from a plurality of side surfaces and the electric power is also applied to the substrate, in order to uniformalize the plasma that is generated.
Figure 4:
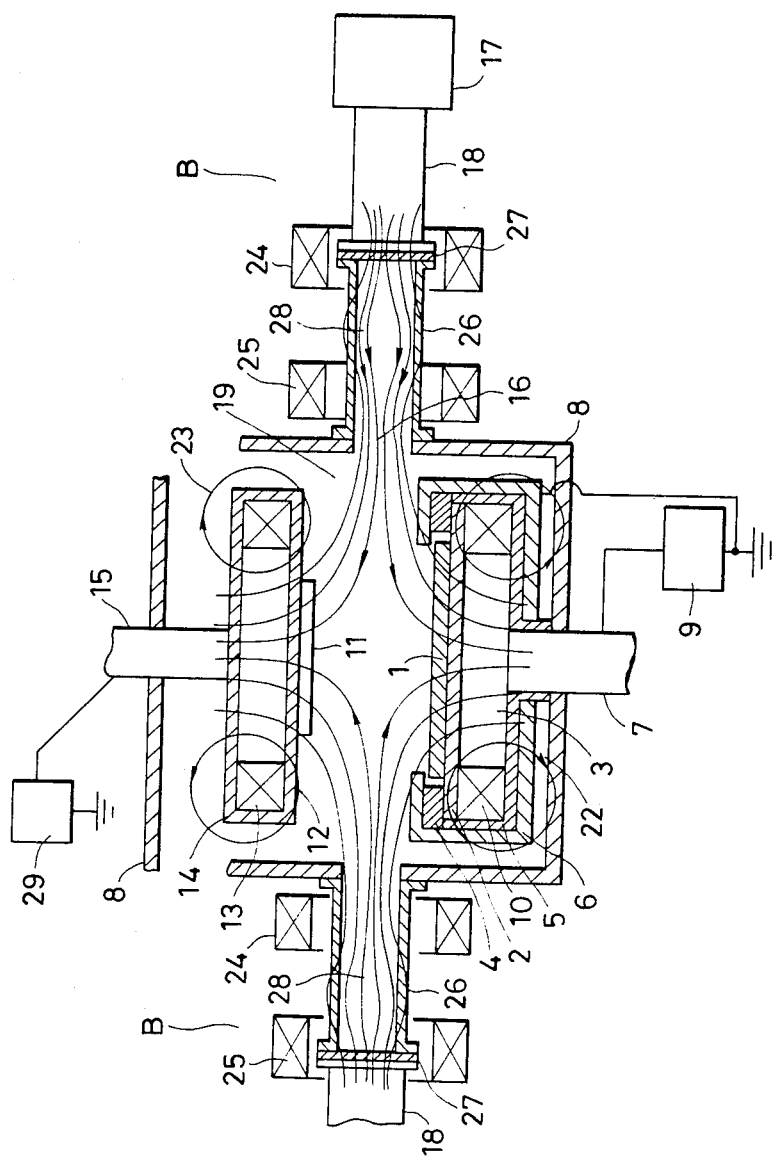

FIG. 3 shows an embodiment in which the embodiment of FIG. 1 is further provided with a microwave source A and a power source 29. FIG. 4 shows an embodiment in which the embodiment of FIG. 2 is further provided with a plasma source B and a power source 29. In the above-mentioned embodiments of the invention, the microwave sources or plasma sources are provided in a plurality of numbers to supply plasma from many directions. Therefore, the plasma exhibits uniform density on the surface of the target, and atoms or particles of target are deposited on the substrate to a uniform thickness in the step of sputtering.

By providing a power source on the side of the substrate to apply a voltage, furthermore, ions in the plasma of atmosphere gas impinge upon the substrate surface to strike a thin film that is deposited on the substrate surface. Therefore, bias sputtering can be effected maintaining controllability to improve the quality of thin film which has deposited.

According to a present invention shown in FIGS. 1 to 4, the plasma of a high density can be generated and confined on the whole surface of target. Further, the generation of plasma and the energy for impinging ions upon the target can be separately controlled.

Figure 5:
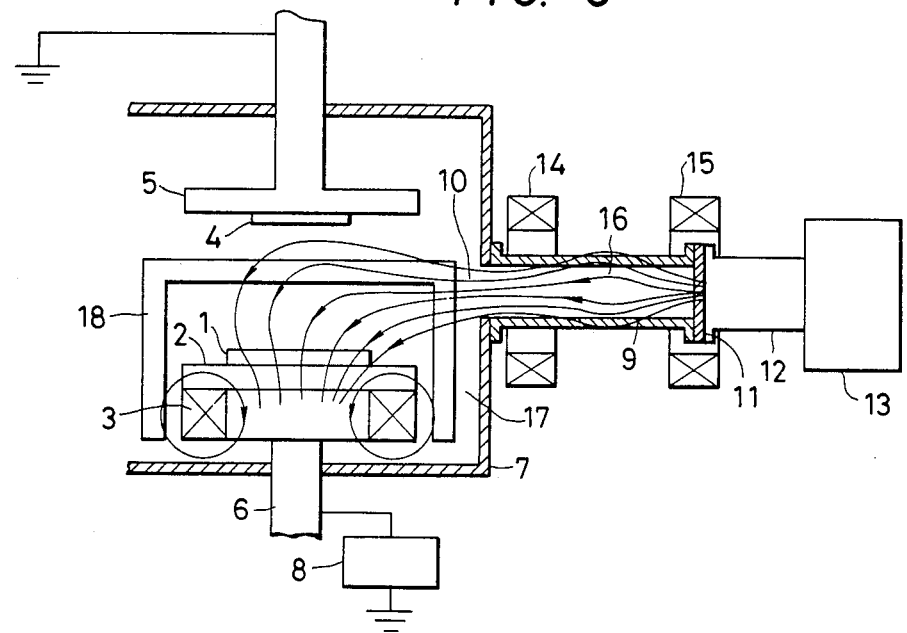
Figure 6:
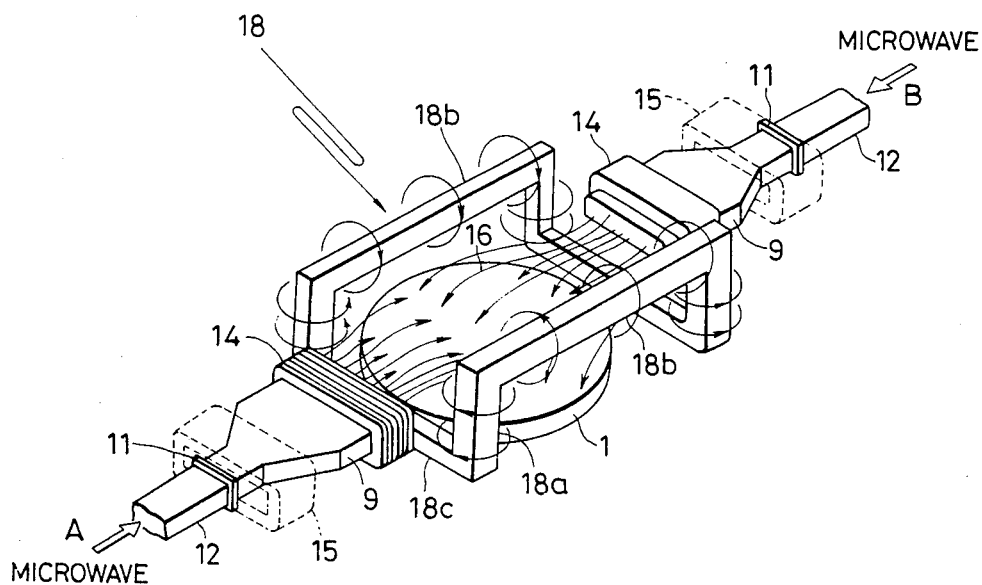

The invention will be described below in conjunction with FIGS. 5 and 6.

Charged particles in the plasma are restricted from moving in a direction which traverses the lines of magnetic force, but are allowed to move chiefly along the lines of magnetic force. Therefore, if provision is made of means to uniformly draw the lines of magnetic force onto the target surface, the substrate is not exposed to the plasma. Plasma of a high density develops on the whole surface of target, contributing to enhancing the utilization efficiency of the target and increasing the film-forming rate. In the embodiment shown in FIGS. 5 and 6, the magnet 18 provided in the sputter film-forming chamber 17 has nearly a rectangular shape, parallel opposing sides 18b thereof being folded toward the substrate holder 5 (FIG. 5), i.e., being upwardly folded in FIG. 6. Reference numeral 18a denotes rising portions formed by folding. Owing to the function of magnet 18a, the lines of magnetic force of magnets 14, 15 are inhibited from spreading in the horizontal directions. Further, owing to the function of the folded sides 18b, the plasma is inhibited from spreading in a direction toward the substrate holder, and the plasma is introduced onto the target by the function of sides 18c that are not folded up. Accordingly, the substrate is not directly exposed to the plasma, and is not damaged by the plasma.

In this embodiment, the plasma is generated maintaining a high density on the whole surface of the target without being spatially diffused. Further, the generation of plasma and the energy for impinging ions upon the target are independently controlled, making it possible to optimize the sputtering conditions. Further, the film can be formed at an increased rate without damaging the substrate by plasma. Moreover, since the plasma is generated on the whole surface of the target, the target utilization efficiency can be enhanced and the production efficiency can be increased. For the purpose of better comprehension, the portions of FIGS. 5 and 6 are explained below:

1 . . . target, 2 . . . cathode, 3 . . . magnet, 4 . . . substrate, 5 . . . substrate holder, 6 . . . shaft, 7 . . . wall of vacuum vessel, 8 . . . power source, 9 . . . waveguides, 10 . . . window, 11 . . . microwave conductor plates, 12 . . . waveguides, 13 . . . microwave source, 14 . . . magnets, 15 . . . magnets, 16 . . . lines of magnetic force, 17 . . . sputter film-forming chamber, 18 . . . magnet, 18a . . . rising portions formed by folding, 18b . . . sides that are folded up, 18c . . . sides that are not folded up.

The invention will be described below in conjunction with FIGS. 7 to 10.

Figure 7:
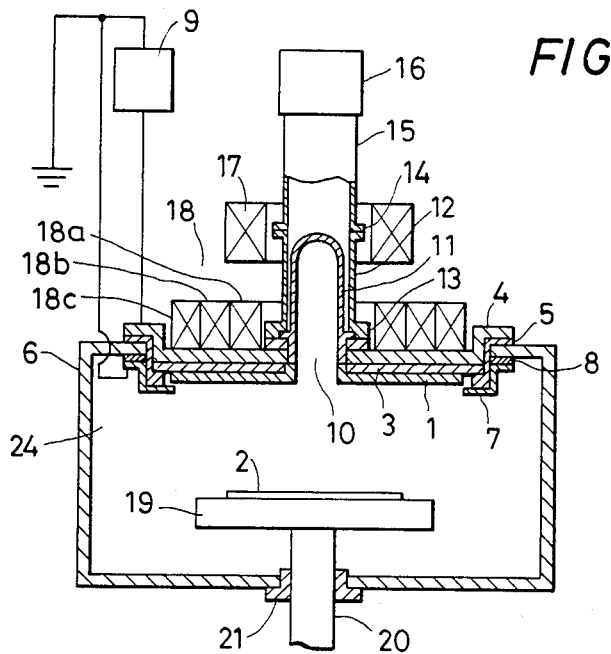
Figure 8:
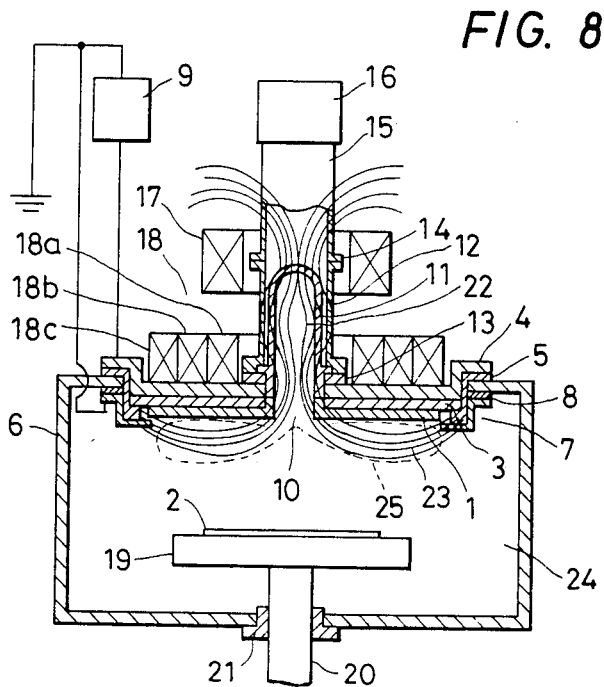

FIGS. 7 and 8 are section views showing the construction of a sputter film-forming portion in the sputtering apparatus of an embodiment. The target 1 and the substrate 2 are opposed to each other, the target 1 being intimately attached to the cathode 4 via a backing plate 2 on the back surface of the target, and the cathode 4 is attached to a vacuum vessel 6 via an insulator 5. The anode 7 is installed via the cathode 4 and insulator 5, and is further installed in the vacuum vessel 6 via an insulting plate 8. The power source 9 is applied across the anode and the cathode. Central portion 10 of the target 1 is made hollow, a plasma generating chamber 11 is formed in this hollow portion, and a waveguide 12 is installed on the cathode 4 via an insulator 13 to surround the plasma generating chamber 11. Another waveguide 15 is mounted on the waveguide 12 through a flange 14, and a microwave generator 16 is attached to the other end of the waveguide 15. Further, a magnetic device 17 is installed to surround the flange 14 of waveguide 15, and another magnetic device 18 is installed on the back surface of the cathode 4. Here, the magnetic device 18 consists of a plurality of magnetic coils 18a, 18b, 18c of which the field intensities can be controlled independently of each other.

The plasma generating chamber 11 is made of a material (such as quartz, alumina porcelain, or the like) which permits microwaves to pass through and which maintains vacuum. The plasma generating chamber 11 is so installed in the vacuum vessel as to maintain vacuum.

Further, the substrate 2 is placed on the substrate holder 19 which is so installed as to maintain electric insulation via an insultor being supported by a shaft 20, and to maintain vacuum.

Being constructed as described above, the magnetic devices 17, 18 constitute a mirror field. As shown in FIG. 8, the lines 22 of magnetic force produced by the magnetic device 17 exhibit a decreased flux density and are spread prior to reaching the magnetic device 18, and are squeezed again at the center of the magnetic device 18. The lines 23 of magnetic force then come out of the hollow portion 10, and are oriented on the target 1 in parallel with the surface thereof, and enter into the cathode 4 at the ends of the target. Here, the sputter film-forming chamber 24 is filled with an atmosphere gas (such as argon gas or the like) and is maintained under a predetermined reduced pressure condition (about $10^{-2}$ to $10^{-4}$ Torr).

The microwaves generated from the microwave generator 16 are guided through the waveguide 15, sent into the waveguide 12, and pass through the plasma generating chamber 11. Owing to the static magnetic field established by the magnetic devices 17, 18, the microwaves ionize the atmosphere gas in the plasma generating chamber 11 thereby to produce plasma.

Here, by setting the central field intensity of magnetic device 17 to be greater than the central field intensity of magnetic device 18, the plasma is sent to the hollow portion of target 1 along the lines 22 of magnetic force, and is further transferred onto the wable surface of target 1 along the lines 23 of magnetic force, so that plasma 25 is generated on the surface of target 1 (FIG. 8). Here, since the static magnetic field is established and the lines 22 of magnetic force run in a direction in which the microwaves proceed, the plasma generated in the plasma generating chamber 11 assumes a high density (plasma density $n_e$ of greater than $10^{11}/cm^3$). Further, since the plasma generating chamber 11 is close to the surface of target 1 and since the electric power is applied to the cathode 4, the charged particles undergo cyclotron motion along the lines 23 of magnetic force and revolve while drifting in the circumferential direction of the target 1. Therefore, the plasma 25 on the surface of target 1 gains a high density.

Electric power applied across the anode and the cathode from the power source 9 generates a negative electric field on the surface of target 1, whereby ions in the plasma are accelerated and impinge upon the surface of target 1. Accordingly, atoms or particles which spring out from the surface of target 1 are deposited on the surface of substrate 2 to form a thin film.

The plasma 25 on the target 1 has such a high density that there exist a large number of ions in the plasma, and a low voltage needs be applied from the power source 9. Therefore, the negative electric field is not excessively intensified on the surface of target 1, and the plasma 25 exists nearly on the whole surface of target; i.e., the target 1 is corroded over a wide region, and receives a small thermal stress.

Further, the target is hollow at the central portion, and no atom or particle will fly from the central portion unlike the conventional art. Therefore, even when the target is corroded over the whole surface, a thin film is uniformly deposited on the surface of substrate 2 without the need of excessively increasing the target diameter. Atoms or particles which spring out from the target 1 are deposited on the substrate 2 at an increased rate, and the film is efficiently formed by sputtering.

A plurality of magnetic coils 18a, 18b, 18c of the magnetic device 18 can be controlled independently of each other. This makes it possible to control the intensity of the magnetic field in parallel with the target 1 in the radial direction of the target, and to control the distribution of density of plasma 25 in the radial direction. Accordingly, atoms or particles spring out in large numbers from the target 1 from the areas of high plasma density, making it possible to control the thickness of film deposited on the substrate 2 in the radial direction.

According to the present invention, the distance can be shortened from a place where the plasma of a high density is generated to the target, and the plasma can be efficiently transferred.

Figure 9:
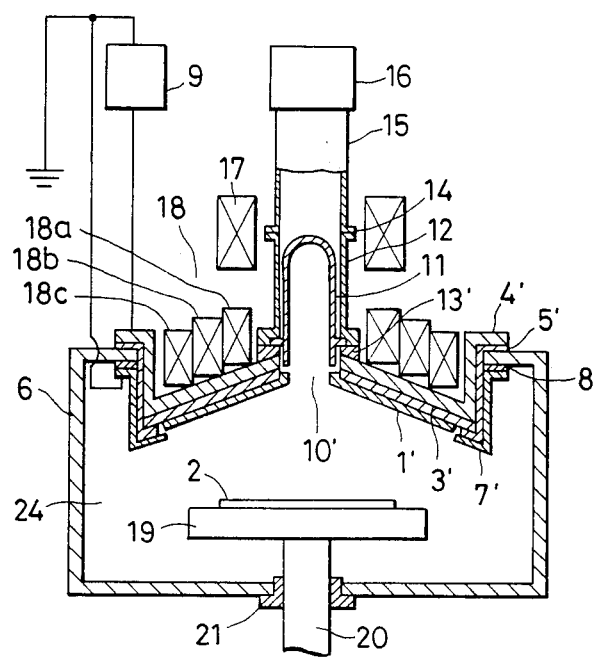
Figure 10:
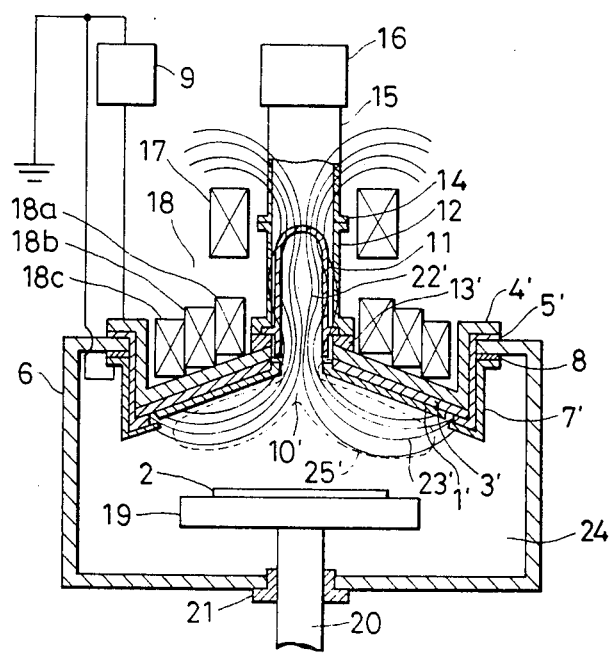

FIGS. 9 and 10 illustrate an embodiment which takes into consideration a cosine law related to a direction in which the sputtered particles fly. The target 1' has the shape of a circular truncated cone in cross section. In the plasma generating chamber 11, the lines of magnetic force run as denoted by 22', pass through the central hollow portion 10', run as denoted by 23', and enter into the cathode 4' at the periphery of target 1'.

By taking the flying direction and amount of sputtered particles into consideration, furthermore, the target is inclined so that particles which spring out from the target are deposited on the substrate at an increased rate.

The invention will be described below in conjunction with FIGS. 11 to 16.

In the sputtering apparatus of this embodiment, the electric power is also applied to the substrate to form a film on the substrate having fine grooves, and to form a film having a flat surface. According to this embodiment, the electric power is applied to the substrate while forming a film by sputtering; i.e., the etching is also effected on the surface of substrate by sputtering while the film is being formed.

Figure 11:
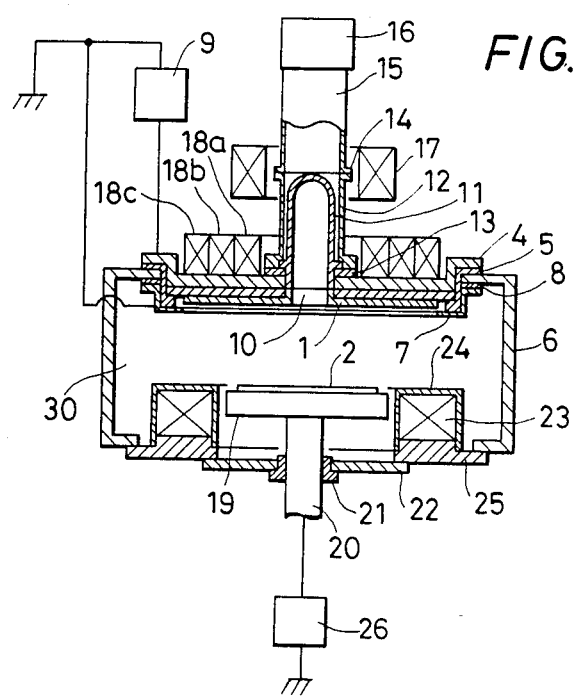
Figure 12:
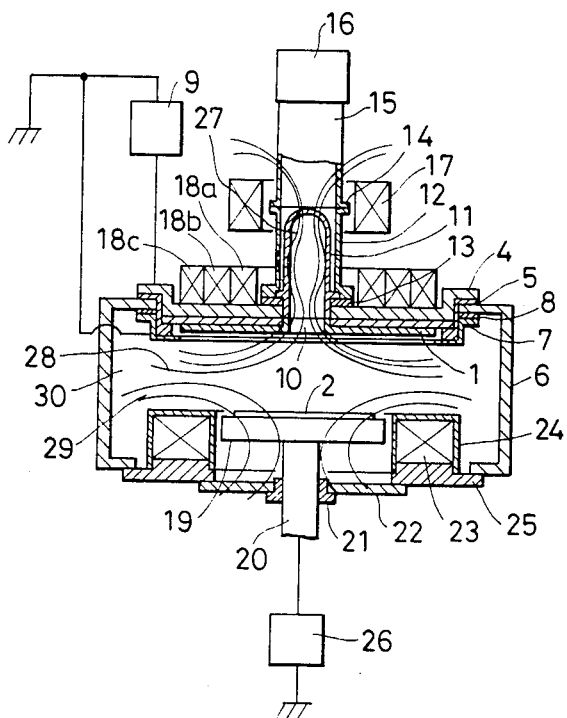

FIGS. 11 and 12 are section views showing construction of the sputtering apparatus according to this embodiment. The substrate holder 19 for placing the substrate 2 is electrically insulated by a shaft 20 via insulator 21, and is installed on a flange 22 to maintain vacuum. The flange 22 is installed on a coil flange 25 on which is mounted a ring-like can 24 that encloses a magnetic device 23, and the coil flange 25 is installed on the vacuum vessel 6 so as to maintain vacuum condition. A power supply 26 is connected to the shaft 20 of the substrate holder 19 to apply a high-frequency electric power to the substrate 2. For other construction, reference should be made to the description of FIG. 7.

The magnetic devices 17, 18 constitute a mirror field and further constitute a cusp field. As shown in FIG. 12, the lines 27 of magnetic force of magnetic devices 17, 18 spread to exhibit a reduced flux density between the magnetic devices 17 and 18, and are squeezed at the centers of magnetic devices 17, 18. Further, the lines 28 of magnetic force which emerge from the magnetic device 18 to the side of target 1 are repelled by the lines 29 of magnetic force of magnetic device 23 on the side of substrate 2, thereby to form a cusp field.

The plasma is confined between the target 1 and the substrate 2 by the cusp field established by the magnetic devices 18 and 23, and exhibits a high density on the surface of target 1. Here, the electric power is applied from the power source 9 to the cathode 4 to generate a negative electric field on the surface of target 1. Therefore, ions in the plasma are accelerated to impinge upon the surface of target 1, and atoms or particles spring out from the surface of target 1 and are deposited on the surface of substrate 2 to form a thin film. Here, the power source 9 supplies electric power of direct current or of a high frequency depending upon the material of target 1.

In forming the film by sputtering, furthermore, electric power of a high frequency is applied from the power source 26 to the substrate holder 19 to generate a negative electric field on the surface of substrate 2. Ions in the plasma are accelerated by the electric field to impinge upon the surface of substrate 2, such that a thin film deposited on the surface of the substrate is etched by sputtering. The substrate condition at this moment is shown in FIGS. 15 and 16. FIG. 15(a) shows a condition where a film is formed by sputtering on a substrate 31 having grooves. As the width of groove decreases, the film 32 deposited by sputtering overhangs as denoted by 34 at corners of film 33 that has been formed, and the opening 36 of groove 35 narrows with the progress of film formation, and finally it becomes difficult to form film on the groove 35. Therefore, the electric power is applied to the substrate 2, and the sputter etching is effected simultaneously with the formation of film by sputtering. Then, as shown in FIG. 15(b), the overhanged portion 34 is etched faster than other portions due to the sputter etching characteristics, and the opening 36 of groove 35 becomes as denoted by 36' enabling the film to be favorably formed in the groove. FIG. 16 shows the condition where the substrate is subjected to the sputter etching while forming the film by sputtering, and a film is further formed. In effecting the etching by sputtering, a maximum etching rate is exhibited when the angle between the angle of incidence of ions and the normal on the surface to be etched is 70° to 80°. Therefore, tilted portions 37 are etched faster than other portions, and the surface of film 32 deposited becomes flat changing from the condition of FIG. 16(a) to the condition of FIG. 16(b). In the conventional apparatus, if the formation of film by sputtering and the etching by sputtering are effected simultaneously, trouble stems from a low plasms density, and the substrate or element is damaged. That is, if the electric power (applied to the substrate) which controls the sputter etching for the substrate is increased while the film is being formed, the energy increases to impinge ions and causes the substrate to be damaged. According to this embodiment in which plasma of a high density is confined between the target and the substrate, however, the increased electric power applied to the substrate does not cause the energy of ions to be so increased as to damage the substrate.

Figure 13:
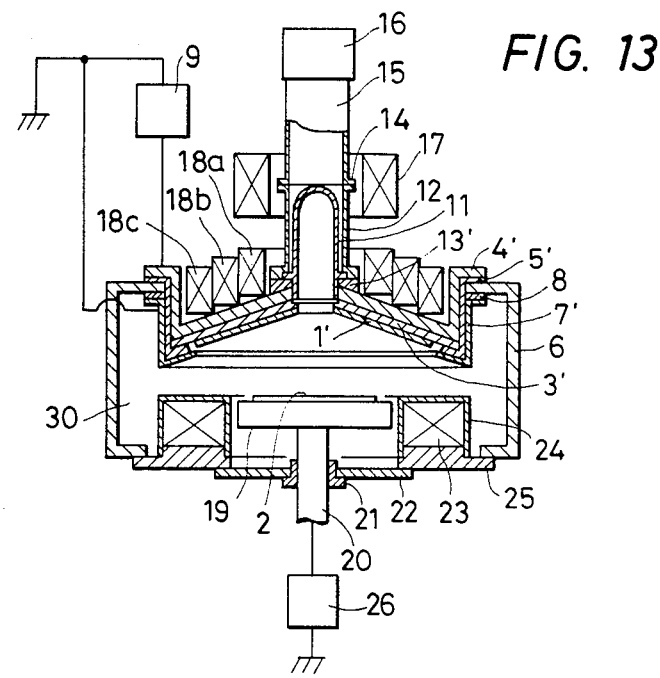
Figure 14:
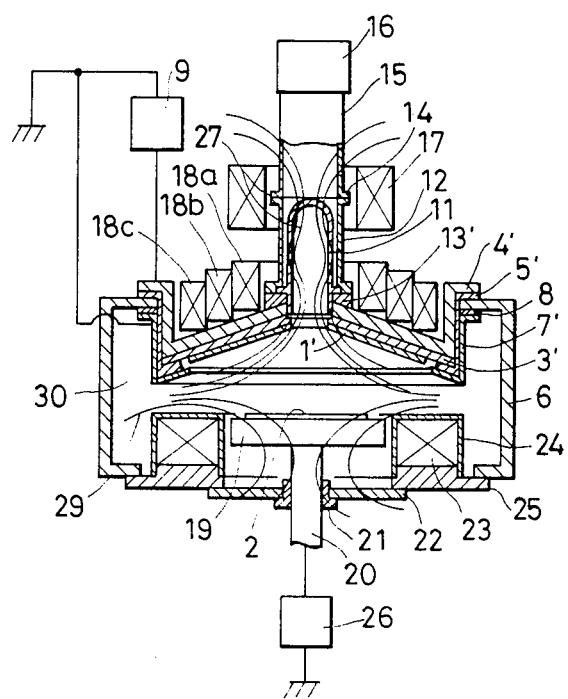
Figure 17:
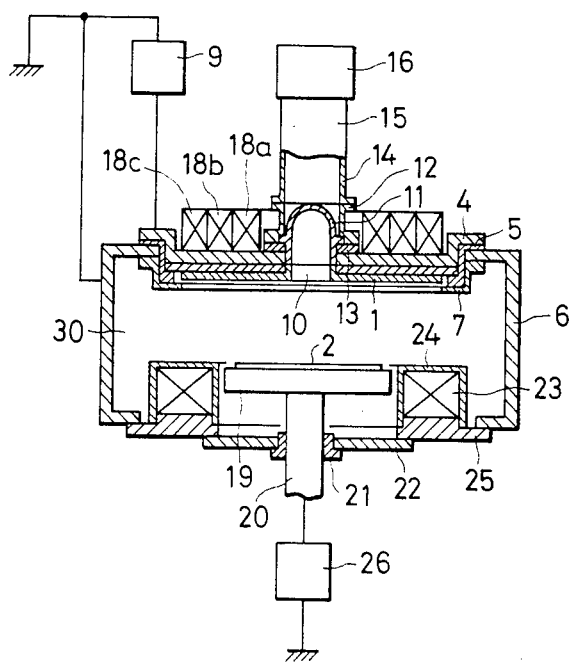
Figure 18:
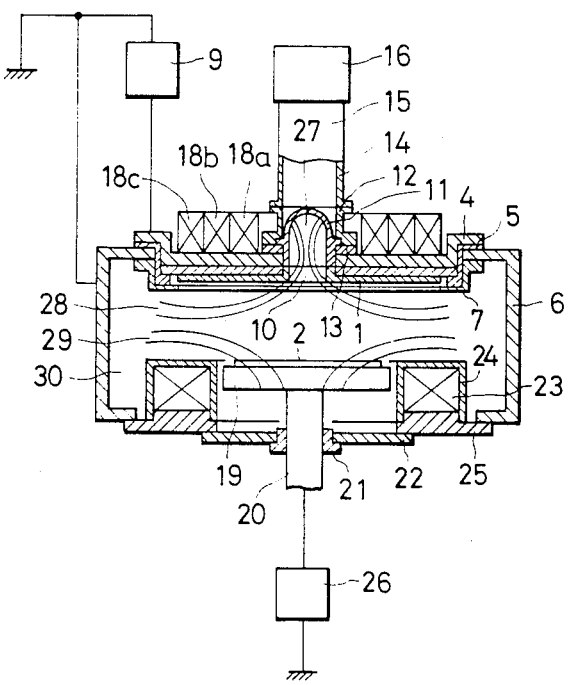
Figure 19:
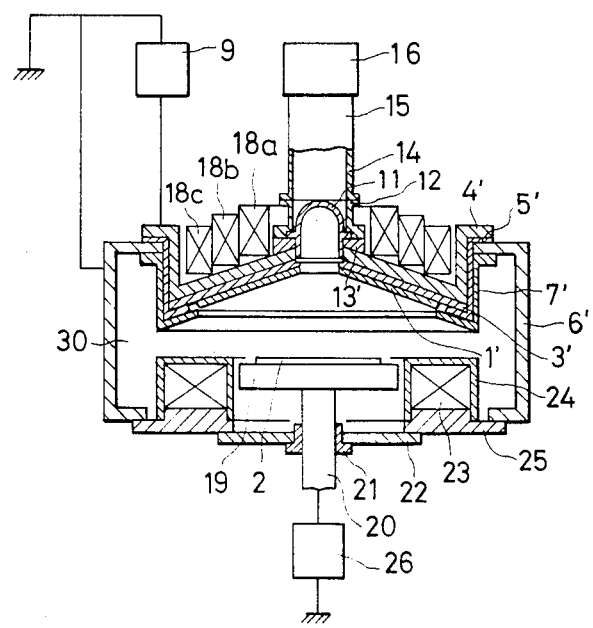
Figure 20:
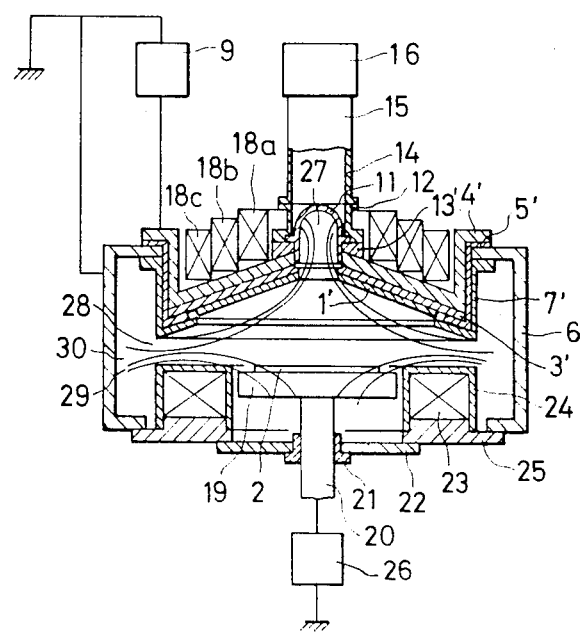

FIGS. 13 and 14 illustrate an embodiment which takes into consideration a cosine law of sputtered particles. This embodiment is the same as the embodiment of FIG. 11 except that cathode 4', insulator 5', backing plate 3' and target 1' have a circular turncated cone shape in cross section. Thus, the target 1' has a surface which is tilted to surround the substrate, and the atoms are deposited on the surface of substrate 2 at an increased rate.

According to the embodiments shown in FIGS. 11 to 14, plasma of a high density excited by microwaves is confined, and the substrate is etched by sputtering without causing damage to the substrate while the film is being formed by sputting. This makes it possible to increase the controllability for forming films or, concretely speaking, to increase the uniformity of film deposited in fine grooves of substrate and to increase the flatness of film that is formed at an increased rate.

FIGS. 17 to 20 illustrate other embodiments which take into consideration a diminution of generated plasma at the generating chamber 11. According to the embodiments shown in FIGS. 17 to 20, the distance between the target 1 and the generating chamber 11 can be fabricated to be shorter than that shown in FIGS. 11 to 14 and the magnetic device provided in a waveguide as shown in FIG. 11 to 14 can be excluded. Thus the diminution of generated plasma accompanied with transportation can be improved.

We claim:

1. A microwave assisting sputtering apparatus comprising:

a cathode having a target composed of a material that is to be sputtered positioned adjacent thereto and having a surface facing a depositing surface of a sample substrate, and a magnetic device positioned at the periphery of said cathode so as to generate a magnetic field that penetrates through said target with lines of force that are directed from the target surface toward the cathode and parallel to at least a portion of the target surface;

a power source connected to a voltage to said cathode;

a substrate holder which holds said sample substrate in a manner to face said target across a gas containing space, and which is provided with a magnetic device positioned at the periphery thereof so as to generate a magnetic field that penetrates through said substrate with lines of force that are directed into the depositing surface of said sample substrate and parallel at least a portion of said depositing surface; and a microwave source and a microwave introducing window through which microwaves from said microwave source are introduced into said gas containing space in a direction parallel to said target and said substrate holder to generate a plasma in said gas containing space for sputtering said target.

2. A microwave assisting sputtering apparatus according to claim 1, wherein a plurality of microwave sources having microwave introducing windows are provided.

3. A microwave assisting sputtering apparatus comprising:
   a cathode having a target composed of a material that is to be sputtered positioned adjacent thereto and having a surface facing a depositing surface of a sample substrate, and a magnetic device positioned at the periphery of said cathode so as to generate a magnetic field that penetrates through said target with lines of force that are directed from the target surface toward the cathode and parallel to at least a portion of the target surface;
   a power source connected to apply a voltage to said cathode;
   a substrate holder which holds said sample substrate in a manner to face said target across a gas containing space, and which is provided with a magnetic device positioned at the periphery thereof so as to generate a magnetic field that penetrates through said substrate with lines of force that are directed into the depositing surface of said sample substrate and aprallel at least a portion of said depositing surface; and
   a plasma source having a plasma introducing window facing said gas containing space and magnetic devices to generate a magnetic field which transfers said plasma into said gas containing space along a path substantially parallel to said target and said substrate holder.

4. A microwave assisting sputtering apparatus according to claim 3, wherein a plurality of microwave sources having microwave introducing windows are provided.

5. A microwave assisting sputtering apparatus comprising:
   a cathode having a target composed of a material that is to be sputtered positioned adjacent thereto and having a surface facing a depositing surface of a sample substrate, and a magnetic device positioned at the periphery of said cathode so as to generate a magnetic field that penetrates through said target with lines of force that are directed from the target surface toward the cathode and parallel to at least a portion of the target surface;
   a power source connected to apply a voltage to said cathode;
   a substrate holder which holds said sample substrate in a manner to face said target across a gas containing space, and which is provided with a magnetic device positioned at the periphery thereof so as to generate a magnetic field that penetrates through said substrate with lines of force that are directed into the depositing surface of said sample substrate and parallel at least a portion of said depositing surface;
   a power source connected to apply a voltage to said substrate holder; and
   a microwave source and a microwave introducing window through which microwaves from said microwave source are introduced into said gas containing space in a direction parallel to said target and said substrate holder to generate a plasma in said gas containing space for sputtering said target.

6. A microwave assisting sputtering apparatus according to claim 5, wherein a plurality of microwave sources having microwave introducing windows are provided.

7. A microwave assisting sputtering apparatus comprising:
   a cathode having a target composed of a material that is to be sputtered positioned adjacent thereto and having a surface facing a depositing surface of a sample substrate, and a magnetic device positioned at the periphery of said cathode so as to generate a magnetic field that penetrates through said target with lines of force that are directed from the target surface toward the cathode and parallel to at least a portion of the target surface;
   a power source connected to apply a voltage to said cathode;
   a substrate holder which holds said sample substrate in a manner to face said target across a gas containing space, and which is provided with a magnetic device positioned at the periphery thereof so as to generate a magnetic field that penetrates through said substrate with lines of force that are directed into the depositing surface of said sample substrate and parallel at least a portion of said depositing surface;
   a power source connected to apply a voltage to said substrate holder; and
   a plasma source having a plasma introducing window facing said gas containing space and magnetic devices to generate a magnetic field which transfers said plasma into said gas containing space along a path substantially parallel to said target and said substrate holder.

8. A microwave assisting sputtering apparatus according to claim 7, wherein a plurality of microwave sources having microwave introducing windows are provided.

9. A microwave assisting sputtering apparatus comprising:
   a cathode having a target composed of a material that is to be sputtered positioned adjacent thereto and having a surface facing a depositing surface of a sample substrate, and a first magnetic device positioned at the periphery of said cathode so as to generate a magnetic field that penetrates through said target with lines of force that are directed from the target surface toward the cathode;
   a power source connected to apply a voltage to said cathode;
   a substrate holder which holds said sample substrate in a manner to face said target across a gas containing space;
   a plasma source having a plasma introducing window facing said gas containing space and second magnetic devices to generate a magnetic field which transfers said plasma into said gas containing space along a path substantially parallel to said target and said substrate holder; and
   a third magnetic device which generates a magnetic field that penetrates through said target and which confines the plasma from said plasma source on the surface of said target only in cooperation with the first magnetic device provided at the periphery of said cathode.

10. A microwave assisting sputtering apparatus according to claim 9, wherein a plurality of microwave sources having microwave introducing windows are provided.

11. A microwave assisting sputtering apparatus comprising:
- a cathode having a target composed of a material that is to be sputtered positioned adjacent thereto with a sputtering surface of said target facing a depositing surface of a sample substrate, and a first magnetic device positioned to generate a magnetic field that penetrates through said target with lines of force that are directed from the sputtering surface toward said cathode, a plasma introducing window being provided in said target and through which plasma is introduced for sputtering said target;
- a power source connected to apply a voltage to said cathode;
- a plasma generating chamber which is located on the opposite side of said target from said sample substrate and which communicates with said plasma introducing window;
- a second magnetic device positioned between said first magnetic device and a microwave generator to generate a magnetic field in said plasma generating chamber to generate and transfer the plasma through said plasma introducing window; and
- a substrate holder which faces said sputtering surface of said target and which holds said sample substrate substantially in parallel to said sputtering surface.

12. A microwave assisting sputtering apparatus according to claim 11, wherein said target and said cathode have circular truncated cone shapes in cross section.

13. A microwave assisting sputtering apparatus according to claim 11, wherein said substrate holder, said target, said cathode, said magnetic device, said plasma generating chamber, said second magnetic device and said microwave generator 16 are arranged along the same axis.

14. A microwave assisting sputtering apparatus comprising:
- a cathode having a target composed of a material that is to be sputtered positioned adjacent thereto with a sputtering surface of said target facing a depositing surface of a sample substrate, and a first magnetic device positioned to generate a magnetic field that penetrates through said target with lines of force that are directed from the sputtering surface toward said cathode, a plasma introducing window being provided in said target and through which plasma is introduced for sputtering said target;
- a power source connected to apply a voltage to said cathode;
- a plasma generating chamber which is located on the opposite side of said target from said sample substrate and which communicates with said plasma introducing window;
- a second magnetic device positioned between said first magnetic device and a microwave generator to generate a magnetic field in said plasma generating chamber to generate and transfer the plasma through said plasma introducing window;
- a substrate holder which faces said target and which holds said sample substrate substantially in parallel to said sputtering surface, and a third magnetic device positioned adjacent said substrate holder to generate a magnetic field that penetrates through said substrate with lines of force that are directed into the depositing surface of said sample substrate; and
- a power source connected to apply a voltage to said substrate holder.

15. A microwave assisting sputtering apparatus according to claim 14, wherein said target and said cathode have circular truncated cone shapes in cross section.

16. A microwave assisting sputtering apparatus according to claim 14, wherein said third magnetic device for generating a magnetic field which penetrates through said substrate, said substrate holder, said target, said cathode, said magnetic device, said plasma generating chamber, said second magnetic device and said microwave generating source are arranged along the same axis.

17. A microwave assisting sputtering apparatus comprising:
- a cathode having a target composed of a material that is to be sputtered positioned adjacent thereto with a sputtering surface of said target facing a depositing surface of a sample substrate, and a first magnetic device positioned to generate a magnetic field that penetrates through said target with lines of force that are directed from the target sputtering surface toward said cathode, a plasma introducing window being provided in said target and through which plasma is introduced for sputtering said target;
- a power source connected to apply a voltage to said cathode;
- a plasma generating chamber which is located on the opposite side of said target from said sample substrate and which communicates with said plasma introducing window;
- a substrate holder which faces said target and which holds said sample substrate substantially in parallel to said sputtering surface, and a second magnetic device positioned adjacent said substrate holder to generate a magnetic field that penetrates through said substrate with lines of force that are directed into the depositing surface of said sample substrate; and
- a power source connected to apply a voltage to said substrate holder.

18. A microwave assisting sputtering apparatus according to claim 17, wherein said target and said cathode have circular truncated cone shapes in cross section.

19. A microwave assisting sputtering apparatus according to claim 17, wherein said substrate holder, said target, said cathode 4, said magnetic device, said plasma generating chamber and said microwave generator are arranged along the same axis.

20. A microwave assisting sputtering method comprising the steps of:
- introducing microwaves onto a planar target which is placed under a predetermined reduced pressure condition, which is opposed to a depositing surface of a sample substrate, and which is composed of a material that is to be sputtered, said microwaves being introduced in a direction parallel to and along the surface of said target;

generating a plasma in a gas containing space between said target and said sample substrate by means of magnetic fields which penetrate through said target and said substrate, so that said plasma is confined by said magnetic fields;

applying an electric field to a cathode to accelerate said plasma toward said target, said cathode holding said target and being provided with a first magnetic device to generate a magnetic field that penetrates through said target; and sputtering said target to emit sputtered particles that consist of a material to be deposited on said substrate, such that the sputtered particles to be deposited on the substrate held by a substrate holder which is opposed to said target and which has a second magnetic device to generate a magnetic field that penetrates through said substrate.

21. A microwave assisting sputtering method according to claim 20, wherein said microwaves are introduced from a plurality of directions along the surface of said target.

22. A microwave assisting sputtering method comprising the steps of:

introducing microwaves onto a planar target which is placed under a predetermined reduced pressure condition, which is opposed to a depositing surface of a sample substrate, and which is composed of a material that is to be sputtered, said microwaves being introduced in a direction parallel to and along the surface of said target;

generating a plasma by a mirror magnetic field while said microwaves are being introduced, and holding the plasma in the space between said target and said substrate by means of magnetic field that penetrate through said target and said substrate;

applying an electric field to a cathode to accelerate said plasma to said target, said cathode holding said target and being provided with a first magnetic device to generate a magnetic field that penetrates through said target; and sputtering said target to emit particles that consist of a material to be deposited on said substrate, such that the sputtered particles to be deposited on the substrate held by a substrate holder which is opposed to said target and which has a second magnetic device to generate a magnetic field that penetrates through said substrate.

23. A microwave assisting sputtering method according to claim 22, wherein said microwaves are introduced and a plasma is generated by said mirror magnetic field from a plurality of directions along the surface of said target.

24. A microwave assisting sputtering method comprising the steps of:

introducing microwaves onto a planar target which is placed under a predetermined reduced pressure condition, which is opposed to a depositing surface of a sample substrate, and which is composed of a material that is to be sputtered, said microwaves being introduced in a direction parallel to and along the surface of said target;

generating a plasma in a gas containing space between said target and said sample substrate by means of magnetic fields which penetrate through said target and said substrate, so that said plasma is confined by said magnetic fields;

applying an electric field to a cathode to accelerate said plasma toward said target, said cathode holding said target and being provided with a first magnetic device to generate a magnetic field that penetrates through said target;

sputtering said target to emit sputtered particles that consist of a material to be deposited on said substrate; and applying an electric field to a substrate holder which holds said substrate to accelerate said plasma toward said substrate to effect sputtering of said substrate, said substrate holder being opposed to said taraget and being provided with a second magnetic device to generate a magnetic field that penetrates through said substrate, said sputtered particles from said target being deposited on the substrate on said substrate holder at the same time the sputtering of said substrate is effected by said plasma.

25. A microwave assisting sputtering method according to claim 24, wherein said microwaves are introduced from a plurality of directions along the surface of said target.

26. A microwave assisting sputtering method comprising the steps of:

introducing microwaves onto a planar target which is placed under a predetermined reduced pressure condition, which is opposed to a depositing surface of a sample substrate, and which is composed of a material that is to be sputtered, said microwaves being introduced in a direction parallel to and along the surface of said target;

generating a plasma by a mirror magnetic field while said microwaves are being introduced, and holding the plasma in the space between said target and said substrate by means of magnetic field that penetrate through said target and said substrate;

applying an electric field to a cathode to accelerate said plasma to said target, said cathode holding said target and being provided with a first magnetic device to generate a magnetic field that penetrates through said target;

sputtering said target to emit sputtered particles that consist of a material to be deposited on said substrate; and applying an electric field to a substrate holder which holds said substrate to accelerate said plasma toward said substrate to effect sputtering of said substrate, said substrate holder being opposed to said target and being provided with a second magnetic device to generate a magnetic field that penetrates through said substrate, said sputtered particles from said target being deposited on the substrate on said substrate holder at the same time the sputtering of said substrate is effected by said plasma.

27. A microwave assisting sputtering method according to claim 26, wherein said microwaves are introduced and a plasma is generated by said mirror magnetic field from a plurality of directions along the surface of said target.

28. A microwave assisting sputtering method comprising the steps of:

introducing microwaves onto a planar target which is placed under a predetermined reduced pressure condition, which is opposed to a depositing surface of a sample substrate, and which is composed of a material that is to be sputtered, said microwaves being introduced in a direction parallel to and along the surface of said target;

generating a plasma by a mirror magnetic field while said microwaves are being introduced, and holding the plasma in the space between said target and said substrate by means of a magnetic field that penetrates through said target and by a first magnetic device which confines said plasma on the surface of said target only;

applying an electric field to a cathode to accelerate said plasma toward said target, said cathode holding said target and being provided with a second magnetic device to generate a magnetic field that penetrates through said target; and sputtering said target to emit sputtered particles that consist of a material to be deposited on substrate, so that said sputtered particles to be deposited on the substrate on a substrate holder which is opposed to said target.

29. A microwave assisting sputtering method according to claim 28, wherein said microwaves are introduced and a plasma is generated by said mirror magnetic field from a plurality of directions along the surface of said target.

30. A microwave assisting sputtering method wherein:

introducing microwaves onto a planar target which is placed under a predetermined reduced pressure condition, which is opposed to a depositing surface of a sample substrate, and which is composed of a material that is to be sputtered, said microwaves being introduced through the center of said target;

generating a plasma by means of magnetic fields that penetrate through said target, so that said plasma is held on the surface of said target;

applying an electric field to a cathode to accelerate said plasma toward said target, said cathode holding said target and being provided with a magnetic device to generate a magnetic field that penetrates through said target; and sputtering said target to emit sputtered particles that consist of a material to be deposited on said substrate, such that causing said sputtered particles to be deposited on said substrate on a substrate holder that is opposed to said target.

31. A microwave assisting sputtering method according to claim 30, wherein said target and said cathode have circular truncated cone shapes in cross section.

32. A microwave assisting sputtering method wherein:

introducing microwaves onto a planar target which is placed under a predetermined reduced pressure condition, which is opposed to a depositing surface of a sample substrate, and which is composed of a material that is to be sputtered, said microwaves being introduced through the center of said target;

generating a plasma by means of magnetic fields that penetrate through said target, so that said plasma is held on the surface of said target;

applying an electric field to a cathode to accelerate said plasma toward said target, said cathode holding said target and being provided with a first magnetic device to generate a magnetic field that penetrates through said target;

sputtering said target to emit sputtered particles that consist of a material to be deposited on said substrate; and applying an electric field to a substrate holder which holds said substrate to accelerate said plasma toward said substrate to effect sputtering of said substrate, said substrate holder being opposed to said target and being provided with a second magnetic device to generate a magnetic field that penetrates through said substrate, said sputtered particles being deposited on the substrate on said substrate holder at the same time the sputtering of said substrate is effected by said plasma.

33. A microwave assisting sputtering method according to claim 32, wherein said target and said cathode have circular truncated cone shapes in cross section.

* * * * *